(12) United States Patent
Rau et al.

(10) Patent No.: US 8,705,185 B2
(45) Date of Patent: Apr. 22, 2014

(54) OPTICAL ELEMENT

(75) Inventors: Johannes Rau, Gerstetten (DE); Armin Schoeppach, Aalen (DE); Bernhard Geuppert, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 13/431,378

(22) Filed: Mar. 27, 2012

(65) Prior Publication Data

US 2012/0194795 A1 Aug. 2, 2012

Related U.S. Application Data

(63) Continuation of application No. 11/994,482, filed as application No. PCT/EP2006/006874 on Jul. 13, 2006, now abandoned.

(60) Provisional application No. 60/699,311, filed on Jul. 14, 2005.

(51) Int. Cl.
  *G02B 7/02* (2006.01)
  *G02B 7/00* (2006.01)

(52) U.S. Cl.
  CPC ................................ *G02B 7/001* (2013.01)
  USPC ........................................................ 359/811

(58) Field of Classification Search
  USPC ........................................................ 359/811
  See application file for complete search history.

(56) References Cited

U.S. PATENT DOCUMENTS

| 3,805,015 | A | | 4/1974 | Herziger et al. |
| 4,028,732 | A | | 6/1977 | Salter et al. |
| 4,336,868 | A | | 6/1982 | Wilson et al. |
| 4,416,349 | A | | 11/1983 | Jacobs |
| 4,615,590 | A | | 10/1986 | Alvarez et al. |
| 4,630,668 | A | | 12/1986 | Waltenspühl |
| 4,657,361 | A | | 4/1987 | Eitel et al. |
| 4,733,945 | A | | 3/1988 | Bacich |
| 4,807,840 | A | * | 2/1989 | Baker et al. ............. 248/559 |
| 5,159,484 | A | | 10/1992 | Yanagisawa et al. |
| 5,182,738 | A | | 1/1993 | Yoshikawa |
| 5,327,733 | A | | 7/1994 | Boolchand et al. |
| 5,798,863 | A | | 8/1998 | Udagawa et al. |
| 5,942,871 | A | | 8/1999 | Lee |
| 6,191,898 | B1 | | 2/2001 | Trunz et al. |
| 6,392,825 | B1 | | 5/2002 | Trunz et al. |
| 6,498,211 | B2 | | 12/2002 | Kobayashi et al. |

(Continued)

FOREIGN PATENT DOCUMENTS

| DE | 84 17 760 U1 | 8/1985 |
| DE | 34 24 255 | 11/1985 |

(Continued)

OTHER PUBLICATIONS

English translation of Japanese Office Action for corresponding JP Appl No. 2008-520802, dated Apr. 5, 2011.

(Continued)

*Primary Examiner* — Scott J Sugarman
*Assistant Examiner* — Vipin Patel
(74) *Attorney, Agent, or Firm* — Fish & Richardson P.C.

(57) ABSTRACT

An optical element has at least one additional element fitted thereon which dissipates the vibrational energy of the optical element by friction.

20 Claims, 6 Drawing Sheets

(56) References Cited

U.S. PATENT DOCUMENTS

| | | | |
|---|---|---|---|
| 6,700,715 B2 | 3/2004 | Sorg et al. | |
| 6,750,947 B1 | 6/2004 | Tomita et al. | |
| 7,012,270 B2 | 3/2006 | Xu et al. | |
| 7,145,270 B2 | 12/2006 | Mizuno | |
| 7,225,453 B2 | 5/2007 | Wade | |
| 2001/0030522 A1 | 10/2001 | Lee | |
| 2003/0201399 A1 | 10/2003 | Xu et al. | |
| 2004/0128679 A1 | 7/2004 | Wade | |
| 2005/0190662 A1* | 9/2005 | Rosmalen | 369/44.15 |

FOREIGN PATENT DOCUMENTS

| | | |
|---|---|---|
| DE | 100 41 993 C1 | 5/2002 |
| EP | 1 186 931 | 3/2002 |
| EP | 1 275 995 A2 | 1/2003 |
| JP | 2-057717 | 2/1990 |
| JP | 02 265034 | 10/1990 |
| JP | 6-123787 | 5/1994 |
| JP | 7-301766 | 11/1995 |
| JP | 07-301766 | 11/1995 |
| JP | 8-166475 | 6/1996 |
| JP | 8-170990 | 7/1996 |
| JP | 11 044834 | 2/1999 |
| JP | 11-044834 | 2/1999 |
| JP | 11-233039 | 8/1999 |
| JP | 11-233426 | 8/1999 |
| JP | 2003-214486 | 7/2003 |
| JP | 2004-340372 | 12/2004 |
| JP | 2005-098325 | 4/2005 |
| JP | 2005-191150 | 7/2005 |
| TW | 2004-15631 | 8/2004 |
| WO | WO 98/55261 | 12/1998 |
| WO | WO 03/060373 | 7/2003 |

OTHER PUBLICATIONS

The International Search Report for the corresponding PCT Application No. PCTEP2006/006874, mailed Dec. 14, 2006.

The International Preliminary Report on Patentability for the corresponding PCT Application No. PCTEP2006/006874, mailed Jan. 16, 2008.

Office Action for the corresponding Japanese Patent Application No. 2008-520802, and English translation thereof, dated Mar. 21, 2012.

Japanese Office Action, and translation thereof, for corresponding JP Appl No. 2008-520802, dated Apr. 2, 2013.

Taiwanese office action, and Taiwanese associate-supplied English translation, in TW Appl No. 095125833, dated Apr. 2, 2013.

Korean Office Action, with English translation, for corresponding KR Appl No. 10-2008-7003464.

* cited by examiner

OPTICAL ELEMENT

CROSS-REFERENCE TO RELATED APPLICATIONS

This application is a continuation of, and claims priority under 35 USC 120 to, U.S. application Ser. No. 11/994,482, filed May 20, 2008, now abandoned which is a National Stage of international application PCT/EP2006/006874, filed Jul. 13, 2006, which claims benefit of U.S. Provisional Application No. 60/699,311, filed Jul. 14, 2005. U.S. application Ser. No. 11/994,482 and international application PCT/EP2006/006874 are hereby incorporated by reference in their entirety.

The invention relates to an optical element, a mount component, a mount for an optical element, a projection objective and a method for producing microstructures.

A system for damping vibrations that act on an optical element in an imaging apparatus is described in U.S. Pat. No. 6,700,715 B1. In this case, vibrations occurring are detected by sensors integrated in the optical element, and frequencies counteracting the natural frequencies introduced by the vibrations or deformations are introduced in the form of an adaptronic control loop by activating piezoelectric elements as actuators. The relatively high complexity of the system is disadvantageous here.

EP 1 275 995 A2 describes an optical system having a number of optical elements with a device for detecting the position of the optical element, which are fitted on a measuring structure that is mounted on a base plate via a spring and a damper.

DE 100 41 993 C1 discloses a damper having a damper mass, an elastomeric spring, a base and a fastening bolt that is intended to be used for absorbing vibrations, in particular in the case of motor vehicles.

DE 84 17 760 U1 describes a vibration damper that can be built onto a unit of a motor vehicle and exists as a spring system with one or more bundles of wires, fibers or strips that are intended to ensure temperature-dependent damping of vibrations.

Such vibration dampers are certainly suitable for the very large vibration amplitudes such as occur in motor vehicles. However, by virtue of their size alone, these vibration dampers cannot be used with optical elements. Moreover, most known vibration dampers have a preferred direction in which they damp particularly well the vibrations occurring, and are, moreover, tuned to specific frequencies.

Since, however, in the case of optical elements or the mounts in which the optical elements are mounted, vibrations of very different frequencies and directions of vibration can occur, such vibration dampers cannot be used for optical elements. Particularly in the case of mounts for optical elements that are fitted with manipulators such as are described for example, in U.S. Pat. No. 6,191,898 B1, the optical element vibrates not only at its natural frequency, but there also occurs vibrations of the manipulator or of the optical element in common with one or more mount components, it being possible for very low natural frequencies that are difficult to control to occur in conjunction with relatively high amplitudes.

It is therefore an object of the present invention to provide an optical element and a mount for an optical element that experience a very good damping of vibration in the case of different vibration frequencies and of different alignments of these vibrations.

This object is achieved according to the invention by means of an optical element having at least one additional element fitted thereon which dissipates the vibrational energy of the optical element by friction.

The object is further achieved by a mount component for an optical element having at least one additional element fitted thereon which dissipates the vibrational energy of the mount component by friction.

The element provided according to the invention which dissipates the vibrational energy of the mount component by friction and can also be denoted as a vibration damper or as a vibration damping device damps the vibrations of the optical element by dissipating the vibrational energy, vibrations being damped in all six degrees of freedom. Here, the element according to the invention transforms the vibrational energy by friction into heat. Within the scope of the present patent application, the term "friction" comprises all effects that are capable of dissipating energy, that is to say, in particular, also by Coulomb friction, internal friction and/or by effects caused by the viscosity or viscoelasticity of the participating materials.

Since the element which dissipates the vibrational energy of the optical element or of the mount component by friction does not itself form a vibrational system, it is effective for a very wide frequency spectrum, it being possible for this effectiveness of the vibrational damping to be improved by increasing the mass of the element which dissipates the vibrational energy of the mount component by friction. By contrast, it is possible to reduce the mass of the element which dissipates the vibrational energy of the mount component by friction when the aim is to damp vibrations of high frequency.

A particular advantage of the element according to the invention consists in the fact that it requires only a very small additional installation space, or no installation space at all in specific embodiments, and can therefore be used without a problem for the most varied applications. In particular, it is also possible for the element which dissipates the vibrational energy of the optical element or of the mount component by friction to be very easily adapted to the respective geometrical conditions of the optical element or of the mount. Moreover, the element according to the invention which dissipates the vibrational energy of the optical element or of the mount component by friction results in a passive vibration damping that therefore requires only a very slight outlay on design.

The element which dissipates the vibrational energy of the optical element or of the mount component by friction is fitted directly on the optical element or on the mount component and not on a holding structure or the like, and so the vibrations are influenced directly. In particular, the element is not arranged between two components vibrating relative to one another, and therefore does not produce direct coupling.

The element according to the invention which dissipates vibrations of the optical element or of the mount component can advantageously be used both with manipulable and with non-manipulable optical elements, it being fitted either on the optical element itself or on a mount component of a mount holding the optical element. There is thereby no change at all in the position of the optical element or of the mount component because of the nature of the vibration damping.

In an advantageous refinement of the invention, it can be provided that the element which dissipates the vibrational energy of the optical element or of the mount component by friction has an additional mass. Such an additional mass substantially increases the possible damping of the vibrations.

When the additional mass is connected to the optical element or to the mount component by means of an adhesive, this results in a very good damping of vibrations. In particular, a soft elastic adhesive such as, for example, a polyurethane elastomer adhesive, can be very well suited to fitting the additional mass on the optical element or the mount. Energy is dissipated inside the adhesive upon the occurrence of vibrations by the internal friction inside the adhesive as well as by viscous effects and effects of entropy elasticity.

Very good results are achieved, furthermore, with reference to the damping of vibrations when the additional mass is arranged on a fibrous medium or is surrounded by a fibrous medium. The fibrous medium can be, for example, a fleece, a felt or a loose tangle of fibers, or else a fiber-modified elastomer, for example.

Moreover, it can be provided that the additional mass is designed as a ring connected to the optical element or to the mount component. For reasons of space, when use takes place in a mount it is obvious to arrange the ring in an annular cutout in the mount component.

When it is provided in an advantageous development of the invention that the element which dissipates the vibrational energy of the mount component by friction is fitted on one or more of those points of the optical element or of the mount component at which the amplitude of the vibration is highest, this results in a particularly good damping of the vibrations of the optical element or of the mount component.

In order to avoid damage to the optical element and to achieve fitting the element which dissipates the vibrational energy of the optical element or of the mount component by friction in as simple a way as possible, it can be provided that the element which dissipates the vibrational energy of the optical element or of the mount component by friction is arranged on the outside of the optical element or of the mount component.

When the element which dissipates the vibrational energy of the optical element or of the mount component by friction has no mechanical contact with an element other than the optical element, or is connected to the mount component to be damped and has no contact with another element, influencing of the damping of vibrations is effectively prevented.

A particularly good damping of vibrations was observed in the case of an embodiment in which the element which dissipates the vibrational energy of the mount component by friction has a container filled with a pourable medium.

The pourable medium can be, for example, sand, a granular material or a powder.

Good results with regard to the damping of vibrations were also achieved with an embodiment in which the element which dissipates the vibrational energy of the optical element by friction has a wire cable having a number of individual wires and on the ends of which respective masses are arranged.

Moreover, in one refinement of the invention it can be provided that the element which dissipates the vibrational energy of the optical element by friction is designed as a tube filled with a pourable medium.

It is to be preferred thereby when the tube consists of a flexible material.

In a further, very advantageous development of the invention, it can be provided that the element which dissipates the vibrational energy of the optical element or of the mount component by friction is tuned to the natural frequency of the optical element or of the mount component. A substantially improved damping of the vibrations results from such a tuning of the element.

When, in a further refinement of the invention, the element which dissipates the vibrational energy of the mount component by friction is arranged in a cutout in the mount component, the result is a very slight space requirement therefor.

In some embodiments a mount for holding an optical element has at least one mount component.

In some embodiments, an alternative solution can consist in a mount having at least two mount components, one of the two mount components having a resilient element that is connected at a contact point to the other mount component and exerts a contact pressure on the latter, an element which dissipates the vibrational energy of the mount by friction being formed by the contact point and the two mount components.

A lithography objective having at least one optical element according to the invention is disclosed herein.

A lithography objective having at least one mount according to the invention is disclosed herein.

A projection exposure machine having an illumination system and having a lithography objective is disclosed herein.

A method for producing semiconductor components by using such a projection exposure machine is disclosed herein.

A number of exemplary embodiments of the invention are illustrated below in principle with the aid of the drawing, in which.

Figure 1:
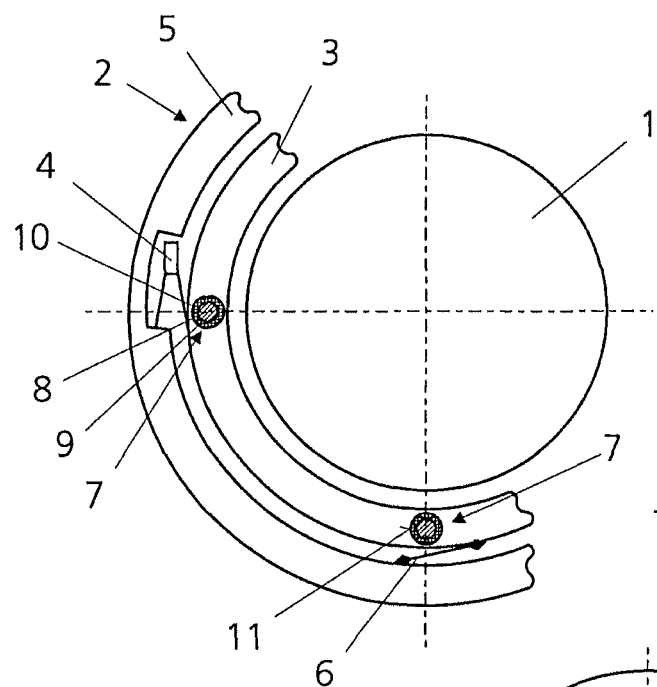
FIG. 1 shows a first embodiment of the inventive element which dissipates the vibrational energy of the optical element by friction, on a mount component of an optical element.

FIG. 1 shows an optical element 1, which is designed in this case as a lens and is held in a mount 2. The mount 2 has two mount components, specifically an inner ring 3, on which the optical element 1 is fitted, and an outer ring 5 connected to the inner ring 3 via an actuating element 4. So as to be able to vary the position of the optical element 1, the inner ring 3 can be moved within certain limits via the actuating element 4, which can be, for example, of the type described in detail in U.S. Pat. No. 6,191,898 B1, and can also be denoted as a manipulator. The inner ring 3 is, moreover, connected to the outer ring 5 via a spring element 6 whose function is likewise described in detail in U.S. Pat. No. 6,191,898 B1, for which reason it is not intended to go into more detail there on the ring. The disclosure content of U.S. Pat. No. 6,191,898 B1 is incorporated in full hereby as the subject matter of the present application. Instead of being designed as a lens, the optical element 1 could also be designed as a mirror or as a prism.

In order to damp vibrations occurring at the optical element 1 and/or the mount 2, provision is made of an element which dissipates the vibrational energy of the optical element by friction and which can also be denoted as a vibration-damping device or vibration damper and is assigned in the present case to the inner ring 3. The element 7 described below in detail and which dissipates the vibrational energy of the optical element 1 by friction has an additional mass 8 that can also be denoted as an inertial mass or as a seismic mass.

The element 7 which dissipates the vibrational energy of the optical element 1 by friction should be tuned as accurately as possible to a natural frequency $f_0$ or to a natural frequency of the spectrum of natural frequencies of the optical element 1 or of the mount component 3 or 5, because the best damping of vibrations can be achieved in this way. Calculation methods known per se can be used to design and dimension the element 7. A large roll in the design of the element 7 which dissipates the vibrational energy of the optical element 1 is played in this case by the mass of said dissipating element, which is determined to a not inconsiderable extent by the additional mass 8. It holds, here that the element 7 must be the more accurately tuned the less the mass of the same. Given a very high mass of the element 7, which reacts less sensitively to the exact adaptation to the desired natural frequency $f_0$ of the optical element 1, it is therefore possible to perform a relatively coarse tuning, or a relatively large range of natural frequencies or a relatively large range of the spectrum of natural frequencies are covered. Thus, it should always be ensured that the mass, determined by the additional mass 8, if appropriate, of the element 7 which dissipates the vibrational energy of the optical element 1 by friction is sufficiently large, for example 1/10-1/100 of the mass of the optical element 1, or of the mount 2 or of the mount component 3 or 5, to be damped.

However, it is not always possible to fit a large mass on the optical element 1, and for this reason it is necessary in the case of relatively low masses to perform a more accurate tuning of the element 7 which dissipates the vibrational energy of the optical element 1. A low mass of the element 7 has the advantage of a slight additional volume and a negligible additional load in the event of shock etc. The natural frequency $f_0$ of the element 7 is calculated as follows:

$$f_0 = \frac{1}{2\pi}\sqrt{\frac{k}{m}},$$

k being the stiffness and m the mass of the element 7.

In the embodiment in accordance with FIG. 1, the additional mass 8 is arranged in a container 10 filled with a pourable medium 9 and which is located in a cutout 11 of the inner ring 3. Sand, a granular material or a powder, for example, can be used as the pourable medium 9 in which the mass 8 is arranged or which forms a part of the mass 8. For example, the mass 8 can be a weight consisting of a metal such as steel, for example and which is loosely embedded in the pourable medium 9. Together with the mass 8, the pourable medium 9 converts the vibrational energy of the optical element 1 and/or of the mount 2 into heat by friction. Of course, it is also conceivable to mix different types of the pourable medium 9. The friction takes place in this case both inside the pourable medium 9 and at the interfaces between the pourable medium 9 and the mass 8.

The damping effect of the element 7 which dissipates the vibrational energy of the optical element by friction can be influenced and optimized by varying the density and/or the grain size or, given different types of the pourable medium 9, by the differences in the densities and/or the grain sizes. The mass 8 is preferably fitted at those points of the mount 2 at which the amplitude of the vibration is highest, that is to say at an antinode, and this leads to optimum damping of vibrations. Instead of the pourable medium 9, it is also possible, if appropriate, to use very viscous liquids, pastes, fats, waxes, elastomers and, in particular, fibers or fibrous media, or mixtures of these components. When use is made of a fibrous medium, the additional mass 8 can be arranged thereon or be surrounded thereby. The pourable medium 9 or the other materials named above can be used to tune the element 7 which dissipates the vibrations of the optical element 1 to a multiplicity of natural frequencies of the optical element 1. Consequently, the above-named problems with regard to tuning the element 7 to the natural frequency of the optical element 1 are circumvented or at least eased. This results from the many different natural frequencies of the individual elements of the pourable medium 9.

Figure 2:
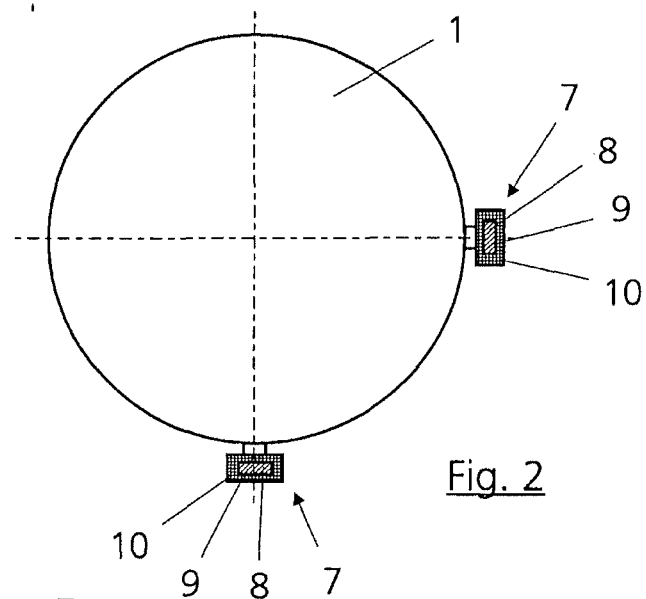
FIG. 2 shows a second embodiment of the inventive element which dissipates the vibrational energy of the optical element by friction, in the case of which the additional mass is arranged on the outside of the optical element.

FIG. 2 shows an embodiment of the element 7 which dissipates the vibrational energy of the optical element by friction, and in this case the mass 8 is likewise fitted in a container 10 filled with the pourable medium 9. However, the container 10 with the mass 8 is arranged on the outside of the optical element 1 and in this way damps the vibrations thereof. The connection of the container 10 to the optical element 1 can be performed, for example, by bonding. It is also to be preferred in this case that the mass 8 is fitted at those points of the optical element 1 at which the amplitude of the vibration is highest, that is to say at an antinode. Consequently, as illustrated in FIG. 2, it is also possible for a number of elements 7 which dissipate the vibrational energy of the optical element by friction to be provided around the periphery of the optical element 1.

Figure 3:
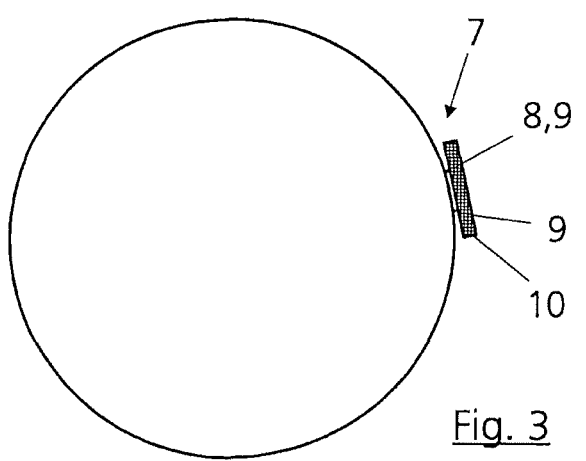
FIG. 3 shows an alternative to the embodiment in accordance with FIG. 2.

In the case of the embodiment of the element 7 which dissipates the vibrational energy of the optical element 1 by friction in accordance with FIG. 3, said element is once again fitted on the outside of the optical element 1, the mass 8 being formed by the pourable medium 9. The pourable medium 9 can take the form of individual particles consisting, for example, of lead or another material of a relatively high density, and be enclosed in the container 10. The container 10 is formed in this case by a foil sealed by means of laser welding, for example.

Figure 4:
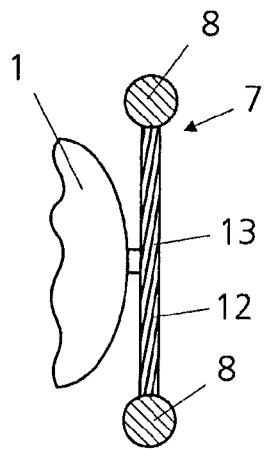
FIG. 4 shows a further alternative to the embodiment in accordance with FIG. 2.

In the case of the embodiment of the element 7 which dissipates the vibrational energy of the optical element 1 by friction in accordance with FIG. 4, two additional masses 8 are arranged at the ends of a wire cable 12, the element 7 being formed as a result. In order to convert the vibrations into heat by internal, dry friction, the wire cable 12 has a number of individual wires 13 that rub against one another in the event of vibrations and thus, together with the mass 8, absorb the vibrational energy of the optical element 1. An element 7 of such a design could also be fitted on one of the two mount components 3 or 5 of the mount 2, so that what is involved is an element 7 which dissipates the vibrational energy of the two mount components 3 or 5 of the mount 2 by friction. The same also holds for the embodiments of FIGS. 5 and 6 described below.

Figure 5:
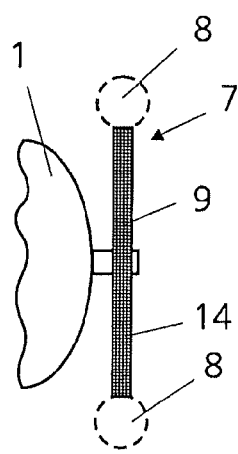
FIG. 5 shows a further alternative to the embodiment in accordance with FIG. 2.

The element 7 in accordance with FIG. 5 has a tube 14 consisting of a flexible material, for example of an elastomer, and which is filled with the pourable medium 9. The tube 14 filled with the pourable medium 9 is already sufficient as the mass which dissipates the vibrations of the optical element 1, and can thus form the element 7. In addition, however, it is also possible here for there to be fitted at the two ends of the tube 14 additional masses 8 that are indicated by dashed lines.

Figure 6:
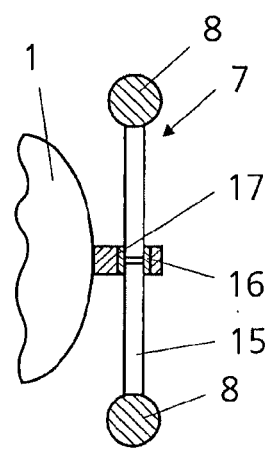
FIG. 6 shows a further alternative to the embodiment in accordance with FIG. 2.

A further embodiment of the element 7 is illustrated in FIG. 6. Here, a stiff rod 15 is provided at both its ends with respective masses 8 and fitted on the optical element 1 via an articulated joint 16, preferably consisting of an elastomer, and a connecting element 17. The elastomer in this case takes over a similar function to the pourable medium 9 described above.

Figure 7:
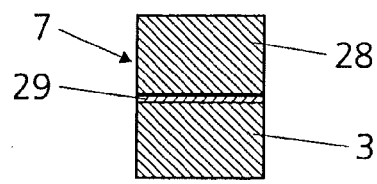
FIG. 7 shows a further embodiment of the inventive element which dissipates the vibrational energy of the optical element by friction.

A further embodiment of the element 7 which dissipates the vibrational energy of the optical element 1 or of the mount components 3 or 5 of the mount 2 by friction is illustrated in section in FIG. 7. Here, a ring 28 constituting the additional mass 8 rests on the inner ring 3 of the mount 2, and a flat component 29 is arranged between the two rings, for example a fibrous material such as, for example, an annular paper or a felt or an elastomer. Here, the additional mass 8 designed as a ring 28, and the flat component 29 together form the element 7, which dissipates the vibrational energy of the mount 2 or of the optical element 1 (not illustrated in this figure) by friction. The friction takes place in this case at the two interfaces between the flat component 29 and each of the two rings 3 and 28, as well as inside the flat component 29. Particularly when there is a fibrous material, the flat component 9 can also be used to tune the element 7 which dissipates the vibrations of the optical element 1 to the natural frequency of the optical element 1, since the element 7 designed in this way has a number of natural frequencies. Moreover, the ring 28 could also consist of a number of individual ring elements of which then one corresponds at least approximately to the natural frequency or one of the natural frequencies of the optical element 1, such that it is possible, if appropriate, to avoid a complicated design of the element 7.

Figure 8:
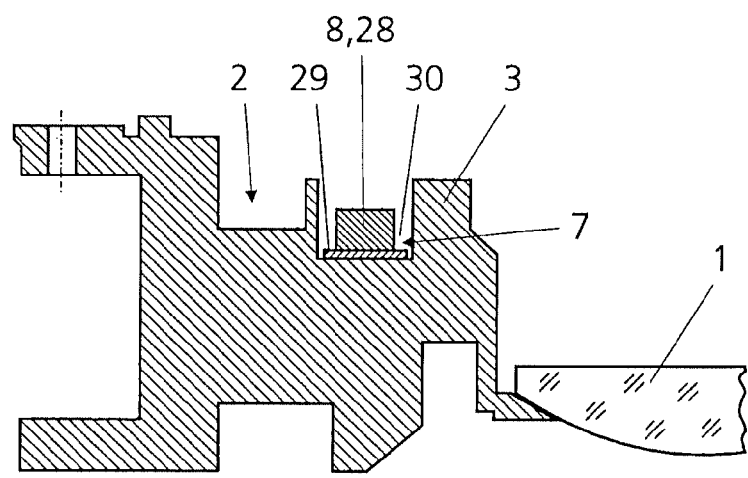
FIG. 8 shows a further embodiment of the inventive element which dissipates the vibrational energy of the optical element by friction.

In the case of the embodiment of the element 7 in accordance with FIG. 8 which dissipates the vibrational energy of the optical element 1 or of the mount components 3 or 5 of the mount 2 by friction, the inner ring 3 of the mount 2 has a recess 30 in which there is arranged the flat component 29 designed in the form of a fleece-like medium such as, for example, a felt, a piece of paper, a fleece or a fiber mat. The flat component 29 is once again preferably of annular design. Located on the flat component 29 is the ring 28, which can consist, for example, of metal. Here, the ring 28 in turn forms the additional, inertial mass 8, and the flat component 29 forms the medium that ensures the friction which dissipates the vibrations. As a result of the recess 30, the element 7 which dissipates vibrations can be accommodated inside the mount 2 in a particularly space saving fashion.

Figure 9:
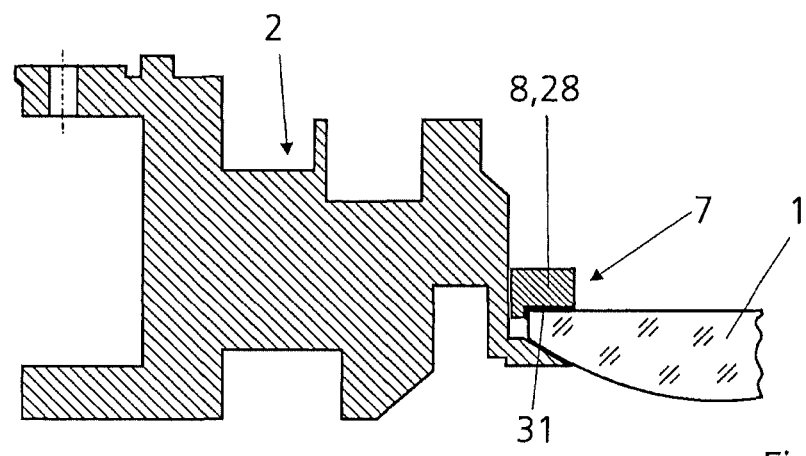
FIG. 9 shows a further embodiment of the inventive element which dissipates the vibrational energy of the optical element by friction.

FIG. 9 illustrates a further embodiment of the element 7 which dissipates the vibrational energy of the optical element 1 or of the mount components 3 or 5 of the mount 2 by friction. Here, the ring 28, consisting of metal, for example, is connected to the optical element 1. This connection of the ring 28 to the optical element 1 can be implemented directly or via an additional component such as, for example, the flat component 29 or, as in the present case, an adhesive 31. This embodiment of the element 7 requires only a very small space, and can also be retrofitted on virtually any optical element 1.

With reference to the damping of vibrations, it has proven to be very well suited to use an adhesive 31, in particular a soft elastic adhesive such as, for example, a polyurethane elastomer adhesive, for fitting the ring 28, which forms the additional mass 8, on the optical element 1. The elastomeric properties of the adhesive 31 contribute substantially to the damping properties thereof. The same also holds for fitting the additional mass 8 on the mount component 2, as described above repeatedly, to which end it is thus likewise possible to use the adhesive 31. Upon the occurrence of vibrations, a dissipation of energy comes about inside the adhesive 31, and this can be explained by the internal friction inside the adhesive 31 as well as by viscous effects and effects of entropy elasticity. In this case, the thickness of the adhesive 31 substantially determines the dimensions of the spring constant.

Here, the adhesive 31 can either be provided unfilled, that is to say as a pure adhesive 31, or in a fashion filled with powder, fibers and/or another suitable material as filler, in order to increase the damping effect. Moreover, it is conceivable to introduce the adhesive 31 both over the entire area and in a punctiform fashion.

The adhesive 31 is also to be taken into account with reference to the above-described adaptation of the element 7 which dissipates the vibrational energy of the optical element 1 by friction, since both the material used and, in particular, the thickness of the adhesive 31, influence the natural frequency of the element 7, and thus the adaptation thereof to the natural frequency of the optical element 1. Particularly when the tolerances with regard to the thickness and to the material properties of the adhesive 31 which determine the stiffness of said optical element are relatively large, the mass of the element 7 should be as large as possible, especially as compared with the mass of the adhesive 31, in order to prevent excessively sharp deviations from the natural frequency of the optical element 1. The type of loading of the adhesive 31 also plays a role in this context, since a different adhesive 31 must be used in the case of a tensile load than in that of a sheer or compressive load.

The stiffness k of the adhesive 31 can be calculated using the following formula:

$$k = \frac{G \cdot A}{a \cdot t}$$

where k=stiffness, G=sheer modulus, A=total adhesively bonded area, t=thickness of the adhesive 31, and α=sheer correction factor (specifies the ratio of total cross-sectional area to the cross-sectional area active for sheer). It holds for rectangular cross sections that:

$$\alpha = \frac{12 + 11 \cdot v}{10(1 + v)}$$

with υ being the transverse contraction coefficient of the adhesive 31.

Figure 10:
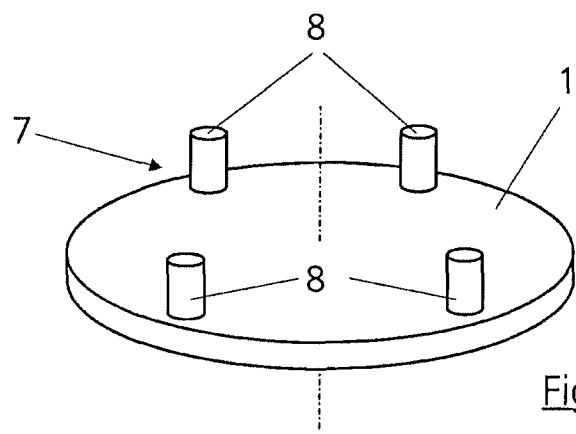
FIG. 10 shows a further embodiment of the inventive element which dissipates the vibrational energy of the optical element by friction.

By contrast with the design illustrated in FIG. 9, there is no need for the ring 28 fitted on the inner ring 3 of the mount 2 to have a constant cross section, nor need the latter be closed, either. As illustrated in FIG. 10, individual additional masses 8 can also be adhesively bonded on the optical element 1, their number being a function of the required damping effect of the element 7. These individual additional masses 8 can also be fitted on the inner ring 3 of the mount 2 in a similar way.

Figure 11:
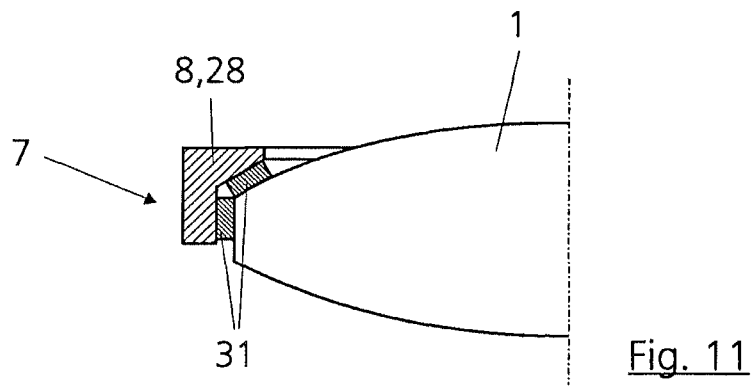
FIG. 11 shows a further embodiment of the inventive element which dissipates the vibrational energy of the optical element by friction.
Figure 12:
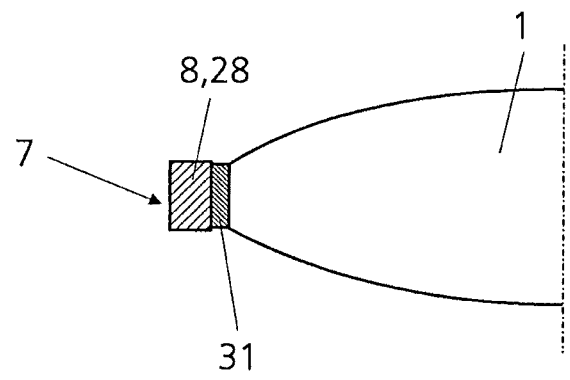
FIG. 12 shows a further embodiment of the inventive element which dissipates the vibrational energy of the optical element by friction.
Figure 13:
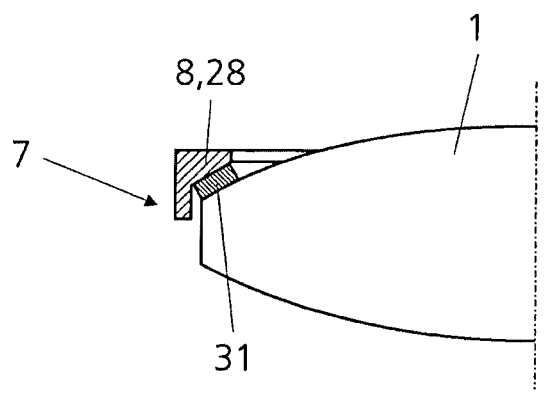
FIG. 13 shows a further embodiment of the inventive element which dissipates the vibrational energy of the optical element by friction.

FIGS. 11, 12 and 13 show various ways of fitting the additional mass 8, which is represented in each case by the ring 28, on the optical element 1.

As explained briefly above, the adhesive 31 is located in FIG. 11 both between the upper surface and the lateral surface of the optical element 1 and the correspondingly designed ring 28, whereas the adhesive 31 is applied only to the cylindrical lateral surface in the case of the design in accordance with FIG. 12, and only to the upper surface of the optical element 1 in the case of FIG. 13, in order to connect the ring 28 to the optical element 1.

Figure 14:
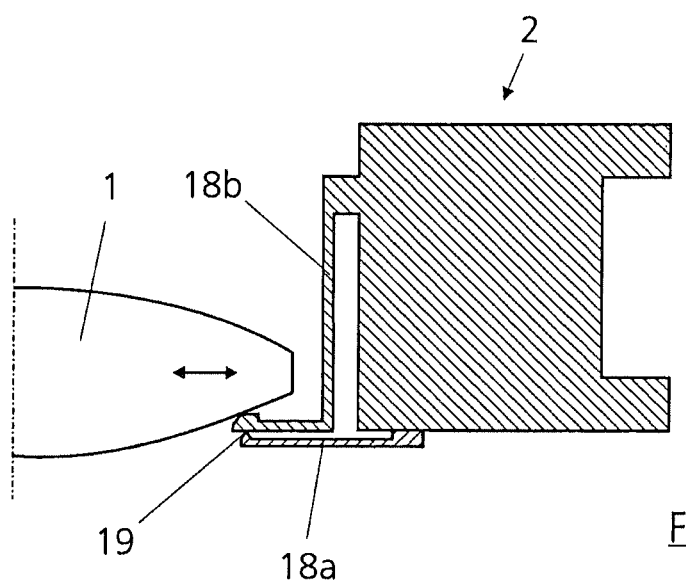
FIG. 14 shows a further embodiment of the inventive element which dissipates vibrational energy of the optical element by friction, in the case of which the additional mass is the mount component coupled to the optical element via at least one resilient element.

FIG. 14 shows a further embodiment of the element 7 which dissipates the vibrational energy of the optical element 1 or of the mount components 3 or 5 of the mount 2 by friction. Here, the mount 2 is coupled to the optical element 1 by two resilient elements 18a and 18b so as to produce between the two resilient elements 18a and 18b a locally restricted friction or contact point 19 at which the resilient elements 18a and 18b exert contact pressures on one another. In this way, the vibrational energy of the optical element 1 is converted into heat by dry friction, and thus the vibrations of the optical element 1 are damped, in the event of moving the two mount components 3 and 5 relative to one another or in the event of a relative movement between the optical element 1 and the resilient elements 18a and 18b or the mount 2. Here, the mount 2 or, in general, one of the mount components 3 or 5, forms the mass 8, and the element 7 is formed by the contact point 19 and the two mount components 3 and 5. It is advantageous that only very slight forces occur which influence the position of the optical element 1 only insubstantially. The resilient element 18b can, for example, be a support for the optical element 1, as is, for example, known from U.S. Pat. No. 6,392,825 or U.S. Pat. No. 4,733,945.

Figure 15:
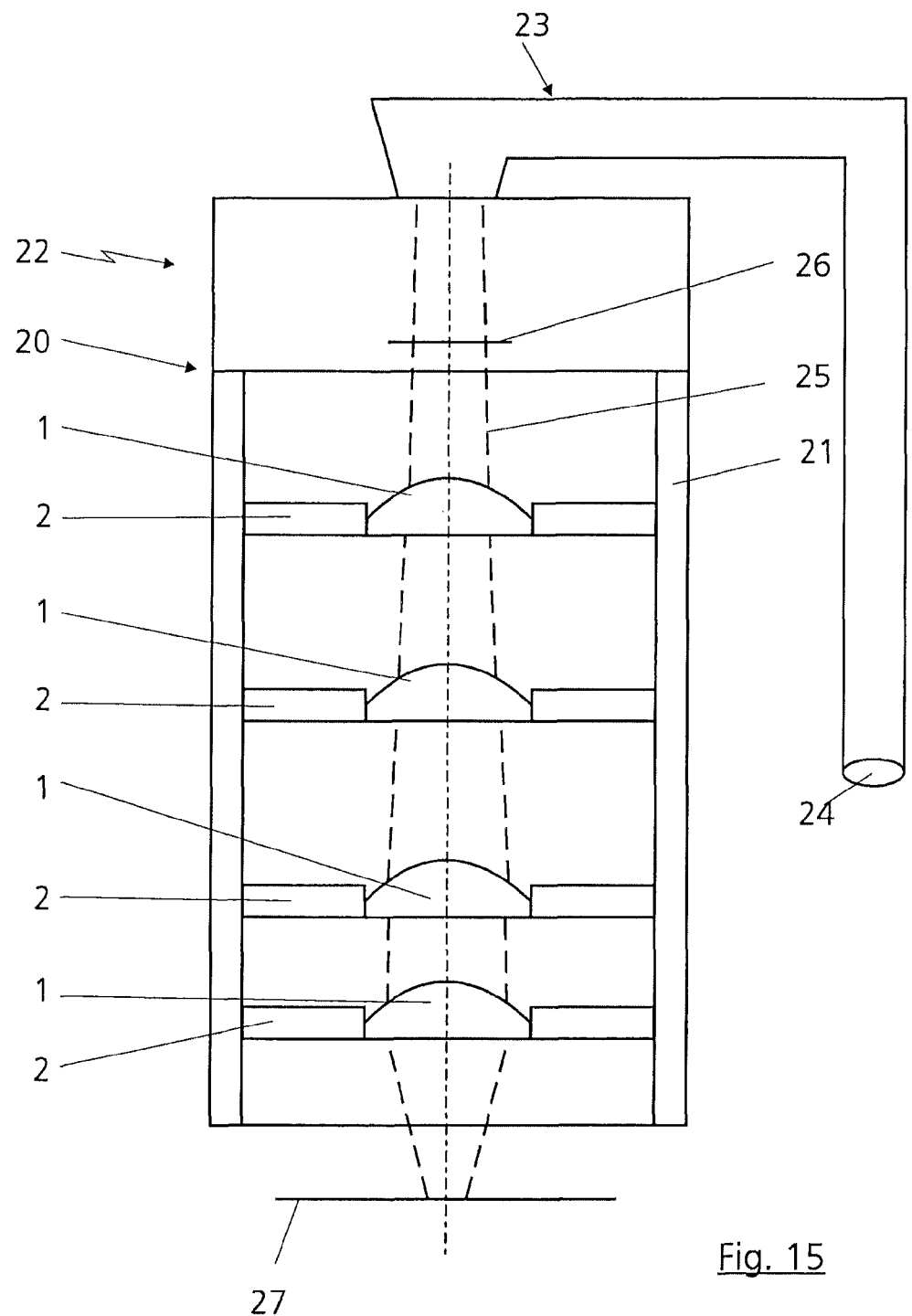
FIG. 15 shows a projection exposure machine having a lithography objective.

A lithography objective 20 is illustrated extremely schematically in FIG. 15. It has a housing 21 in which a number of optical elements 1 are arranged and held, preferably by means of appropriate mounts 2. The lithography objective 20 is part of a projection exposure machine 22 that serves the purpose of producing semiconductor components and has an illumination system 23, fitted on the top side of the lithography objective 20, with a light source 24 that transmits a beam path 25 through the lithography objective 20 with the aid of which a reticle 26 is imaged in a manner known per se onto a wafer 27 located below the lithography objective 1. This projection exposure machine 22 can therefore be used to carry out a method for producing semiconductor components that is known per se and therefore not described in more detail below. Here, it is preferred for at least one of the optical elements 1 and/or at least one of the mounts 10 to be provided with an element 7, described above, which dissipates the vibrational energy of the optical element 1 or of the mount components 3 or 5 of the mount 2 by friction.

Figure 16:
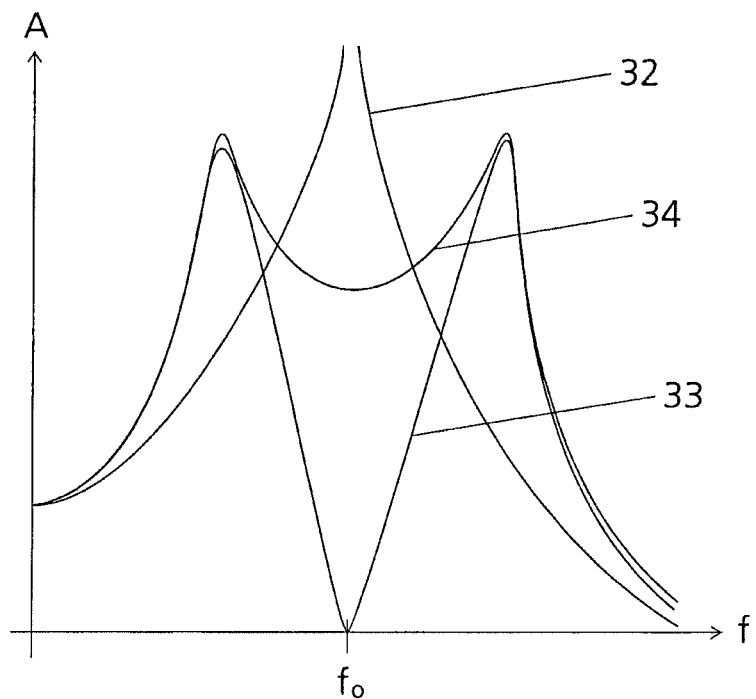
FIG. 16 shows a graph for illustrating the inventive damping of vibrations in the case of weak damping.

FIG. 16 shows a graph in which various amplitude profiles are plotted against frequency f. Here, the line denoted by "32" shows the vibration amplitude A of the optical element 1 in the region of its natural frequency $f_0$ without the inventive element 7. It is to be seen here that there is a very high vibration amplitude in the case of the natural frequency $f_0$ of the optical element 1 or of the mount 2 on which the optical element 7 can be fitted. However, an element 7 that is designed for this natural frequency $f_0$ but which is very weakly damped, results in the curve denoted by "33" of the vibration amplitude of the optical element 1 or of the mount 2, measured at the optical element 1 or at the mount 2, in the case of which because of the design there is no longer any or at least only a very little vibration amplitude at the natural frequency $f_0$, but there are two secondary maxima, which can also be very disturbing. The run of the vibration amplitude of the element 7 is illustrated by the reference "34". The absolute value of the vibration amplitude of the element 7 does not have to be in conformity with the vibration amplitude of the optical element 1.

Figure 17:
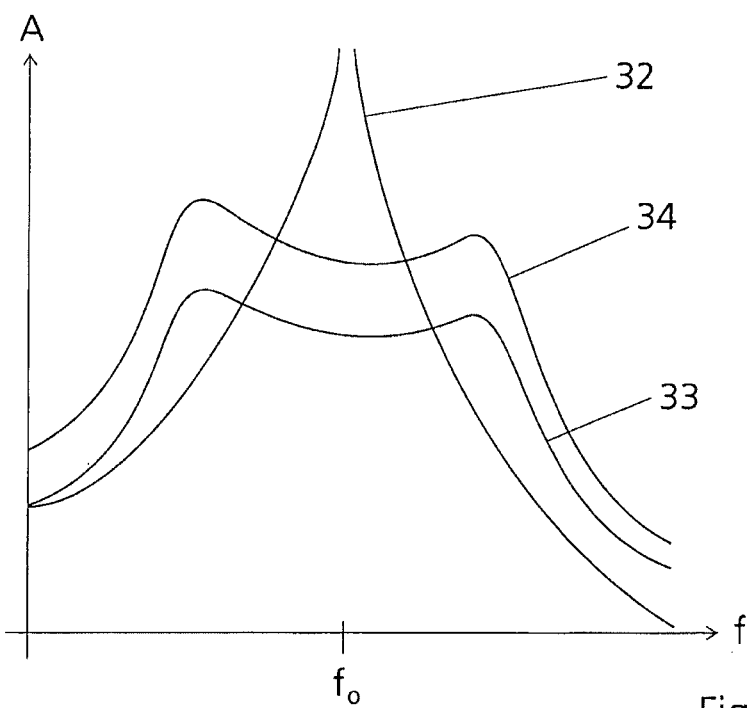
FIG. 17 shows a graph for illustrating the inventive damping of vibrations in the case of strong damping.

In principle, the same curves are illustrated in FIG. 17, there now being a strongly damped element 7 which dissipates the vibrations of the optical element 1. It is to be seen that the curve denoted by "32" is identical to that of FIG. 16, whereas in the case of a stronger damping by the element 7 there is still a relatively large amplitude at the natural frequency $f_0$, although the two secondary maxima are substantially lower. It becomes plain from this that concerning the damping of the optical element 1 with a broadband stimulation a better effect is achieved given relatively strong damping of the element 7. As in FIG. 16, the curve 34 in FIG. 17 also shows the amplitude of the element 7.

What is claimed is:

1. A system, comprising:
   an optical element;
   a mount holding the optical element;
   an element connected to the mount, the element comprising an additional mass, the additional mass comprising a ring connected to the mount; and
   a second element supported by the ring or the optical element,
   wherein:
   the element is configured so that, when the mount undergoes vibration,
   the element dissipates vibrational energy of the mount via Coulomb friction, the ring is concentrically disposed around the optical element; and
   the second element is configured so that, when the mount undergoes vibration, the element dissipates vibrational energy of the mount via Coulomb friction.

2. The system of claim 1, wherein the additional mass is connected to the mount via an adhesive.

3. The system of claim 1, wherein the additional mass is arranged on a fibrous medium.

4. The system of claim 1, wherein the additional mass is surrounded by a fibrous medium.

5. The system of claim 1, wherein the ring is arranged in an annular cutout in the mount.

6. The system of claim 1, wherein the optical element comprises a lens.

7. The system of claim 1, wherein the element is fitted on one or more of those points of the mount at which the amplitude of the vibration is highest.

8. The system of claim 1, wherein the element is connected exclusively to the mount and has no contact with another element.

9. The system of claim 1, wherein the element is arranged in a cutout in the mount.

10. The system of claim 1, wherein the element is tuned to the natural frequency of the mount.

11. The system of claim 1, wherein the element comprises a container containing a pourable medium having individual particles.

12. The system of claim 11, wherein the pourable medium is sand.

13. The system of claim 11, wherein the pourable medium is a granular material.

14. The system of claim 11, wherein the pourable medium comprises a powder.

15. The system of claim 1, wherein the additional mass comprises a wire cable comprising a number of individual wires with ends, respective masses being disposed on the ends of the wires.

16. The system of claim 1, wherein the optical element comprises a mirror.

17. An objective, comprising:
a system as claimed in claim 1,
wherein the objective is a lithography objective.

18. A projection exposure machine, comprising:
an illumination system; and
a lithography objective comprising a system as claimed in claim 1,
wherein the projection exposure machine is a semiconductor lithography projection exposure machine.

19. A method, comprising:
using a projection exposure machine to produce semiconductor components, the projection exposure machine comprising:
an illumination system; and
a lithography objective comprising a system as claimed in claim 1,
wherein the projection exposure machine is configured to produce semiconductor components.

20. The system of claim 1, wherein the system is configured to be used in a semiconductor lithography objective.

* * * * *

UNITED STATES PATENT AND TRADEMARK OFFICE
CERTIFICATE OF CORRECTION

PATENT NO. : 8,705,185 B2
APPLICATION NO. : 13/431378
DATED : April 22, 2014
INVENTOR(S) : Johannes Rau et al.

It is certified that error appears in the above-identified patent and that said Letters Patent is hereby corrected as shown below:

In the Specification

In Col. 8, lines 47-48 (approx.), delete " $k = \dfrac{G \cdot A}{a \cdot t}$ " and insert -- $k = \dfrac{G \cdot A}{\alpha \cdot t}$ --.

Signed and Sealed this
Twenty-second Day of July, 2014

Michelle K. Lee
*Deputy Director of the United States Patent and Trademark Office*